United States Patent
Kanno et al.

(10) Patent No.: US 6,825,617 B2
(45) Date of Patent: Nov. 30, 2004

(54) SEMICONDUCTOR PROCESSING APPARATUS

(75) Inventors: Seiichiro Kanno, Ibaraki (JP); Ryoji Nishio, Kudamatsu (JP); Ken Yoshioka, Hikari (JP); Saburou Kanai, Hikari (JP); Hideki Kihara, Kudamatsu (JP); Hideyuki Yamamoto, Kudamatsu (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 10/373,711

(22) Filed: Feb. 27, 2003

(65) Prior Publication Data

US 2004/0168767 A1 Sep. 2, 2004

(51) Int. Cl.$^7$ .................................................. H01J 7/24
(52) U.S. Cl. ............................. 315/111.21; 219/121.54; 118/725
(58) Field of Search ....................... 315/111.21, 111.51, 315/111.71, 111.91; 118/723 MP, 723 E, 725, 728; 422/62, 91, 82.12, 104; 219/121.4, 121.43, 121.36, 121.54, 121.58

(56) References Cited

U.S. PATENT DOCUMENTS 5,543,689 A * 8/1996 Ohta et al. ............... 315/111.21
6,592,817 B1 * 7/2003 Tsai et al. ..................... 422/62
6,616,767 B2 * 9/2003 Zhao et al. .................. 118/723

FOREIGN PATENT DOCUMENTS

JP          2002/305188    * 10/2002

* cited by examiner

Primary Examiner—Haissa Philogene
(74) Attorney, Agent, or Firm—Antonelli, Terry, Stout & Kraus, LLP (57) ABSTRACT

A semiconductor processing apparatus that processes a semiconductor wafer disposed in a process chamber of a processing apparatus main unit includes a setting unit for enabling a user to set a temperature of the semiconductor wafer and control unit for controlling a processing of the semiconductor wafer based on the temperature of the semiconductor wafer set by the setting unit.

11 Claims, 8 Drawing Sheets

| ITEM | | SETTING VALUE | MONITOR VALUE |
|---|---|---|---|
| ETCH TIME | (SEC) | 60 | 28 |
| ETCHING GAS | Ar MASS FLOW (sccm) | 300 | 300 |
| | $O_2$ MASS FLOW (sccm) | 0 | 0 |
| | $C_4F_8$ MASS FLOW (sccm) | 10 | 10 |
| PRESSURE IN PROCESS CHAMBER | PRESSURE IN PROCESS CHAMBER (Pa) | 1 | 1 |
| SOURCE POWER SUPPLY | SUPPLIED POWER (W) | 1000 | 995 |
| | REFLECTED WAVE (W) | - | 12 |
| | Vpp (V) | - | 850 |
| BIAS POWER SUPPLY | SUPPLIED POWER (W) | 800 | 794 |
| | REFLECTED WAVE (W) | - | 3 |
| | Vpp (V) | - | 760 |
| ELECTROSTATIC CHUCK | APPLIED VOLTAGE (V) | 300 | 300 |
| WAFER STAGE | INITIAL TEMPERATURE (°C) | 25 | - |
| REFRIGERANT | TEMPERATURE OF REFRIGERANT (°C) | 8 | 8 |
| | MASS FLOW OF REFRIGERANT (L/min.) | 4 | 4.2 |
| | AT INLET OF REFRIGERANT (°C) | - | 20.2 |
| | AT OUTLET OF REFRIGERANT (°C) | - | 24.6 |
| | HEAT INPUT (W) | - | 456 |
| REAR SURFACE HELIUM | PRESSURE (Pa) | 1000 | 996 |
| | MASS FLOW (sccm) | - | 4.6 |
| HEATER | POWER OF HEATER 1 (W) | 0 | 0 |
| | POWER OF HEATER 2 (W) | 0 | 0 |
| TEMPERATURE OF WAFER | AVERAGE TEMPERATURE (°C) | 79.8 | 79.3 |

FIG. 4

| ITEM | | SETTING VALUE | MONITOR VALUE |
|---|---|---|---|
| ETCH TIME | (SEC) | 60 | 28 |
| ETCHING GAS | Ar MASS FLOW (sccm) | 300 | 300 |
| | $O_2$ MASS FLOW (sccm) | 0 | 0 |
| | $C_4F_8$ MASS FLOW (sccm) | 10 | 10 |
| PRESSURE IN PROCESS CHAMBER | PRESSURE IN PROCESS CHAMBER (Pa) | 1 | 1 |
| SOURCE POWER SUPPLY | SUPPLIED POWER (W) | 1000 | 995 |
| | REFLECTED WAVE (W) | - | 12 |
| | Vpp (V) | - | 850 |
| BIAS POWER SUPPLY | SUPPLIED POWER (W) | 600 | 598 |
| | REFLECTED WAVE (W) | - | 3 |
| | Vpp (V) | - | 600 |
| ELECTROSTATIC CHUCK | APPLIED VOLTAGE (V) | 300 | 300 |
| REFRIGERANT | TEMPERATURE OF REFRIGERANT (°C) | 20 | 20 |
| WAFER STAGE | INITIAL TEMPERATURE (°C) | 40 | - |
| REAR SURFACE HELIUM | PRESSURE (Pa) | 1000 | 1000 |
| HEATER | POWER OF HEATER 1 (W) | 0 | 0 |
| | POWER OF HEATER 2 (W) | 0 | 0 |

| TEMPERATURE OF WAFER (°C) | 81 |
|---|---|

SEMICONDUCTOR PROCESSING APPARATUS

BACKGROUND OF THE INVENTION

1. Field of the Invention

The present invention relates to a semiconductor processing apparatus. In particular, it relates to a semiconductor processing apparatus that processes a semiconductor wafer while adjusting the temperature thereof.

2. Description of the Related Art

With the recent trend toward higher and higher packaging density of semiconductor devices, circuit patterns are becoming increasingly smaller, and dimension precision requirements are being increasingly severe. With this demand, temperature control of the wafer being processed has become very important. For example, in an etching process in which a high aspect ratio is required, in order to implement anisotropic etching, etching is performed while depositing an organic polymer on the side wall of the part being etched. However, deposition of the organic polymer covering the side wall is varied under the influence of temperature. That is, the temperature of the wafer being processed affects the etch rate or the resulting shape, and if the temperature distribution is non-uniform, the amount of deposited sidewall protective film varies in the surface of the wafer. As a result, there arises a problem in that the resulting shape varies with location in the wafer surface, and the circuit patterns of semiconductor elements cut from the wafer and thus, the performances thereof vary among the elements.

In addition, in recent semiconductor manufacturing processes, wafers with larger diameters are handled, and the plasma, the applied power and the heat input from the apparatus to the wafer are increased. For example, in semiconductor manufacture involving a wafer having a diameter of 300 mm, a bias power in the order of 3 kW is applied to the wafer during the process of etching an interlayer insulating film formed on the wafer. In view of such a circumstance, in a semiconductor manufacturing apparatus, it is technically essential that the temperature of the semiconductor wafer is appropriately controlled in the surface of the wafer during the processing thereof.

In a conventional semiconductor manufacturing apparatus using a plasma, a wafer being plasma-processed is electrostatically stuck to and held on a stage (sample holder) by the action of electrostatic chuck provided on the stage. In addition, in order to assure adequate heat transfer between the wafer and the stage to adjust the temperature of the wafer, a heat conductive gas (typically, helium) is introduced to adjust the temperature of the wafer.

The range of the temperature of the wafer to be adjusted varies with the process. For example, the temperature of the stage that holds the wafer is required to be stably controlled over a wide range from a low temperature of −40° C. to a temperature on the order of 100° C. during the processing of the wafer. That is, it has become necessary that even if the wafer stage in the plasma processing apparatus is subjected to a significant heat input ranging widely from low temperature to high temperature, an uniform temperature distribution is provided in the surface of the wafer.

In addition, in recent years, demands for non-volatile memories including MRAM and FeRAM have been increased. To etch the materials of these memories, an extremely high temperature of 400° C. to 500° C. is required. In this case also, since redeposition of a reaction product affects the etching, it is required to properly control the wafer temperature.

As a technique for controlling the temperature of the wafer being processed, there is disclosed a technique in which first and second heat conductive gases are introduced between the wafer and a support for carrying the wafer, and the pressures of the first and second gases are controlled to adjust the heat conduction. In addition, this prior art discloses a technique in which, in order to process the wafer while keeping the temperature thereof constant in the above-described arrangement, an object to be processed for monitoring is used and the temperature distribution in the surface thereof is previously determined, and then, the amounts of the first and second heat conductive gases supplied and discharged via a first and second gas channels are set (for example, see Patent Reference 1).

[Patent Reference 1]

Japanese Patent Laid-Open No. 2002-305188

SUMMARY OF THE INVENTION

However, in the prior art described above, in order to provide a desired temperature distribution on the wafer, it is necessary that the amounts of the first and second heat conductive gases supplied and discharged are registered with a control unit of the apparatus. If they are not registered, it is required to separately measure the surface temperature to find a condition that provide the desired temperature distribution, and thus, it disadvantageously takes a long time to determine the processing condition.

For example, it is difficult for the operator who uses the apparatus to predict the temperature of the wafer before starting the processing and accurately set the operation conditions of the apparatus based on the prediction to implement a desired processing.

Thus, if the operator changes an operation condition of the apparatus or a parameter of the etching processing so as to bring the etching characteristics closer to a desired one, the wafer temperature is also changed in accordance with the set condition values or combination thereof, and thus, the desired etching characteristics cannot be attained. Thus, there is a problem in that the precision of the processing of the semiconductor device is degraded.

For example, a case will be described where a target etch rate is not attained and the bias power is increased to 800 W. Here, it is assumed that the temperature of the wafer finally attained after being processed for 60 seconds at 600 W is known from experiment or measurement by the fluorescent thermometer. Since the temperature of the wafer attained when it is processed at a bias power of 800 W is not known, if the wafer is processed under the same condition, the average temperature thereof varies largely. If the temperature varies largely in this way, the temperature affects the resulting etching characteristics, and thus, it is difficult to assess the effect of the changed condition based on comparison with the previously obtained result and to operate the apparatus under the condition that enables precise processing.

Thus, data concerning the He back side gas pressure, the refrigerant temperature, the initial stage temperature and the like that are not changed if the bias power is increased to 800 W are required. However, according to the prior art, the operator who uses the apparatus must find an adequate condition on a trial-and-error basis, so that it may take a long time to find the adequate condition, and thus, the process of setting an adequate condition and starting operation of the apparatus so as to manufacture products with a predetermined performance is degraded in efficiency. In this example, when the He back side gas pressure is set at 1.5 kPa, the average temperature of 82° C. is attained finally. However, in general, it is difficult for the operator to predict and set the He back side gas pressure down to the second decimal place, and it takes a long time to predict and set the value.

For example, to obtain precise data, the apparatus is operated plural times under different conditions, such as under different He back side gas pressures of 1.4 kPa, 1.5 kPa and 1.6 kPa. During this operation, it is difficult for the apparatus to perform processing so as to implement desired etching, and the throughput of the semiconductor processing is reduced. Besides, even if the data resulting from a plurality of times of operations is used, extremely large number of operations is required to bring the average value of the temperature of the wafer 1 in a direction parallel to the surface thereof within a narrow range (for example, within ±0.5° C.). Therefore, the experiment preceding the processing for manufacturing the semiconductor devices to be shipped takes an extremely long time.

A first object of the invention is to provide a semiconductor processing apparatus with an improved operation efficiency.

A second object of the invention is to provide a semiconductor processing apparatus capable of processing a semiconductor wafer with a higher precision.

The above-described objects are attained by providing means, when a semiconductor wafer is processed in a semiconductor processing apparatus, for enabling the temperature of the wafer during the processing to be set. Furthermore, the objects can be attained by determining an operation condition that realizes the set temperature and operating the semiconductor processing apparatus based on the result to process the semiconductor wafer.

More specifically, the above-described objects are attained by a semiconductor processing apparatus that processes a semiconductor wafer mounted therein, comprising: setting means for enabling an user to set a temperature of the semiconductor wafer; and control means for controlling a processing of the semiconductor wafer based on the temperature of the semiconductor wafer set by the setting means.

The above-described objects are attained by a semiconductor processing apparatus that plasma-processes a semiconductor wafer mounted on a stage placed in a container, comprising: setting means for enabling an user to set an temperature of the semiconductor wafer; and control means for controlling an operation of the semiconductor processing apparatus based on information related to the temperature of the semiconductor wafer set by the setting means.

Furthermore, the above-described objects are attained by the semiconductor processing apparatus further having a function of setting an operation condition of the semiconductor processing apparatus based on the set temperature of the wafer.

Furthermore, the above-described objects are attained by the fact that conditions of the operation include at least one of a temperature of a thermal medium that adjusts a temperature of a sample stage on which the semiconductor is mounted, a heater for heating the sample stage, a pressure of a gas introduced between the semiconductor wafer and the sample stage, and a high frequency power applied to the sample stage.

Furthermore, the above-described objects are attained by the semiconductor processing apparatus further comprising: display means for displaying the set operation condition; and input means for enabling the user to input the operation condition.

DETAILED DESCRIPTION OF THE PREFERRED EMBODIMENTS

Embodiments of the invention will be described below with reference to the drawings.

Figure 1:
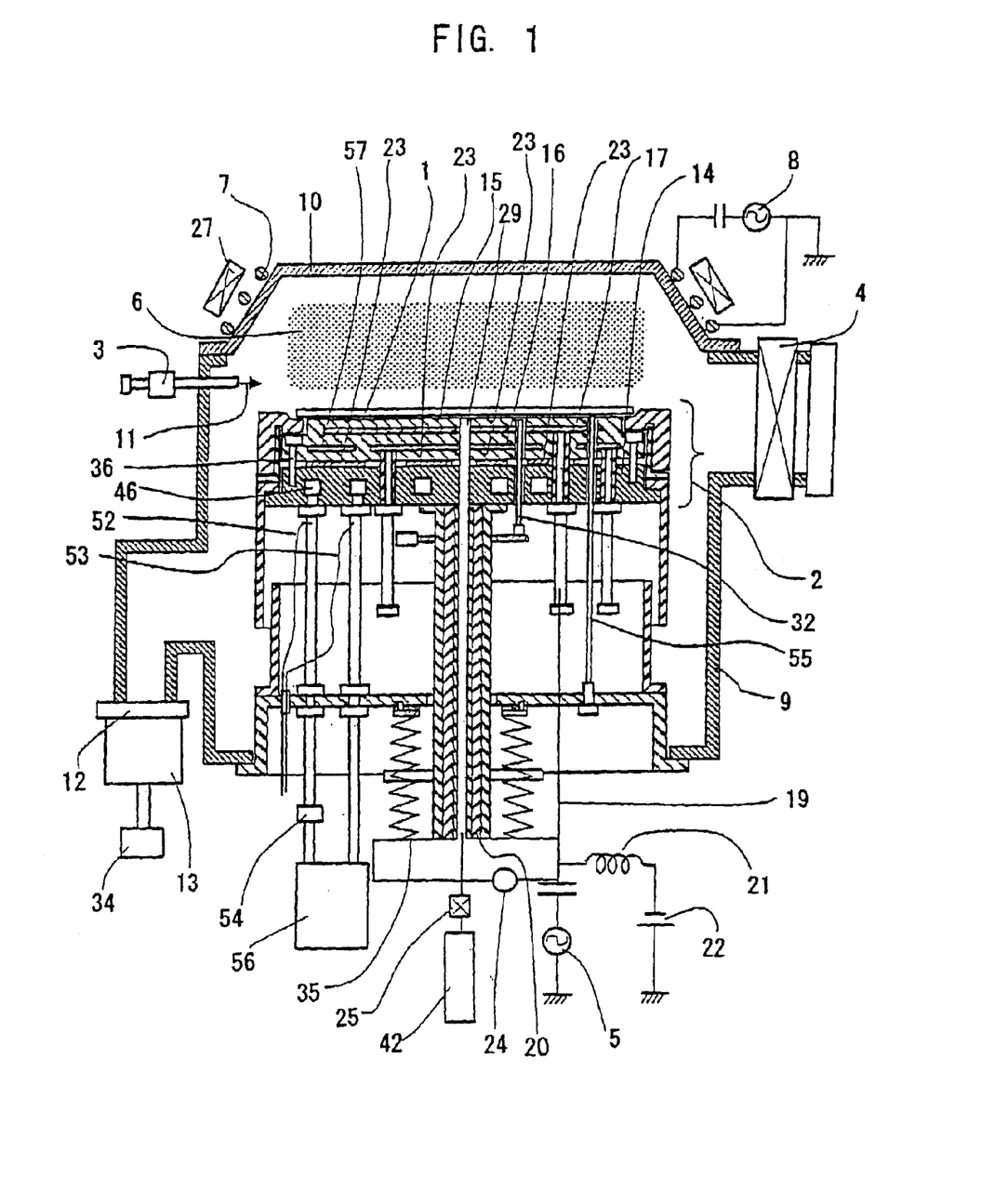
FIG. 1 shows a wafer processing apparatus according to a first embodiment of the invention.
Figure 2:
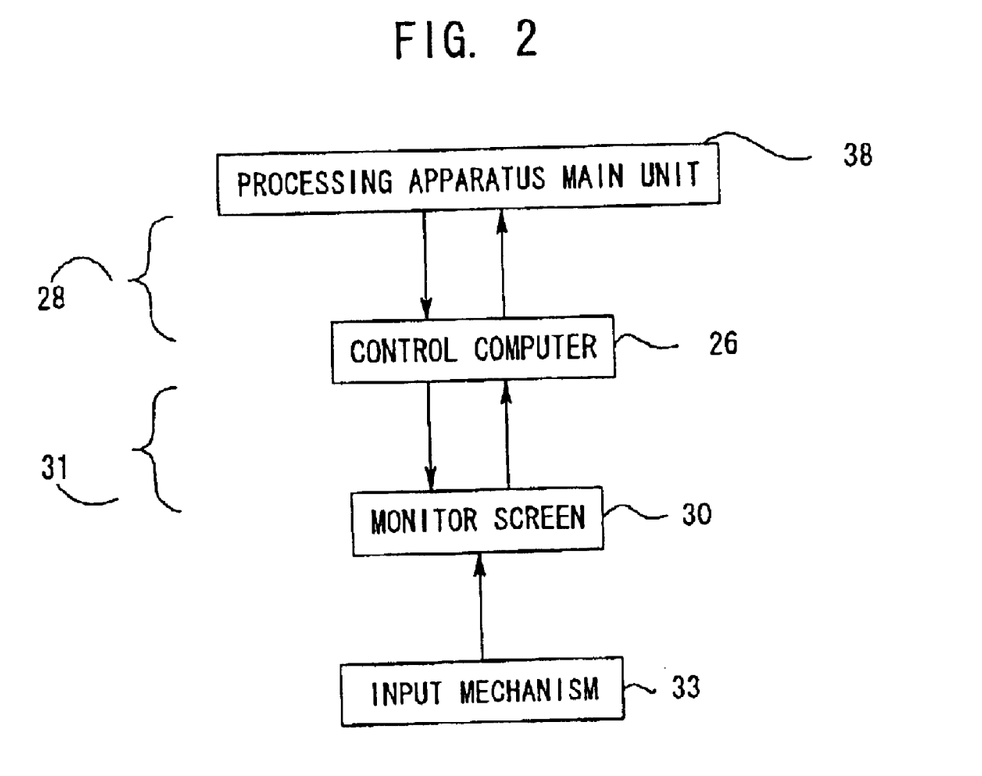
FIG. 2 shows a control arrangement according to the first embodiment of the invention.
Figure 3:
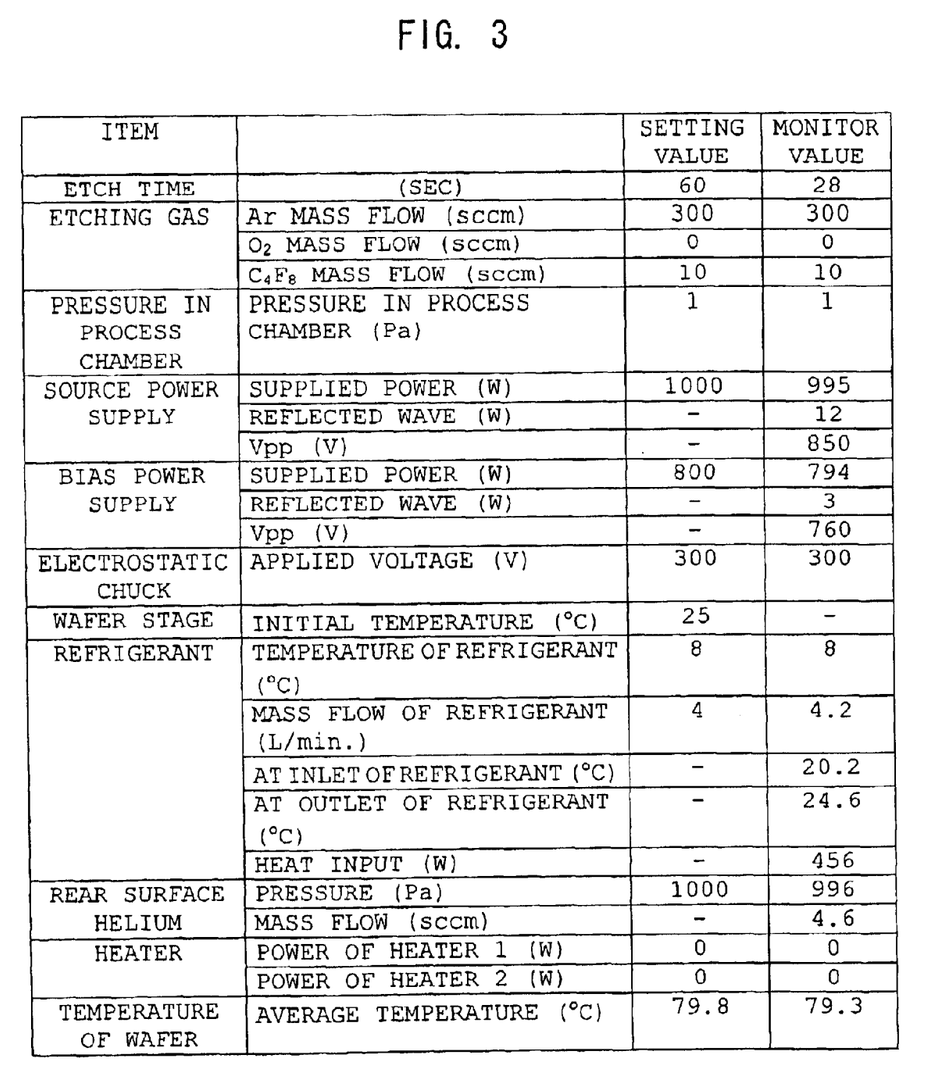
FIG. 3 is a view of a monitor screen according to the first embodiment of the invention.

FIGS. 1 to 3 show a first embodiment of the invention. FIG. 1 shows a main unit of a wafer processing apparatus according to the invention. FIG. 2 shows a control mechanism. FIG. 3 is a detailed view of a monitor screen.

As shown in FIG. 1, an etching gas 11 is introduced into a vacuum chamber 9, and the pressure in the chamber is maintained at an adequate level by adjusting the opening of a valve 12 installed upstream from a turbo-molecular pump 13. Reference numeral 34 denotes a rotary pump. A bell jar 10 made of alumina is mounted over an upper part of the vacuum chamber, and a coil 7 is wound around the bell jar. The coil 7 is connected to a high frequency power supply B. A high frequency voltage, for example, of 13.56 MHz is applied across the coil to generate an inductively coupled plasma 6. A plurality of fans 27 are installed around the bell jar to keep the temperature of the bell jar constant. A wafer 1 is subjected to etching when it is exposed to the plasma. During the etching, the wafer is mounted on a wafer stage 2, and the temperature thereof is sensed by sensor means.

To apply a bias voltage to the wafer 1, the wafer stage 2 is connected to the high frequency power supply 5. In addition, a direct current power supply 22 is connected to a feeder line 19 of the high frequency power supply to provide the wafer stage 2 with an electrostatic chuck capability. In this drawing, reference numeral 3 denotes a mass flow controller for adjusting the mass flow of the etching gas, reference numeral 4 denotes a gate valve, which is opened when the wafer 1 is transported to allow a carriage arm (not shown) to pass through. Reference numeral 32 denotes a pusher pin for attaching or detaching the wafer to or from the stage. A vertical motion mechanism (not shown) expands or shrinks bellows 35 to move the whole wafer stage 2 vertically, thereby mounting or separating the wafer 1 on or from the wafer stage 2. During this operation, the wafer 1 is passed from/to the carriage arm to/from the wafer stage.

In this first embodiment, the wafer stage 2 comprises a cooling jacket 14, a ceramics plate 15 having a heater function and an electrostatic chuck function disposed above the cooling jacket 14, and a heat conductive sheet (member) 23 interposed therebetween, which are fastened by bolts 36. In the cooling jacket 14, a channel 46 for passing a refrigerant therethrough is provided, and the refrigerant is supplied from a circulator 56 provided externally.

The mass flow of the refrigerant is measured by a flow meter 54, the temperatures of the refrigerant where it flows out of and back to the circulator are measured by thermocouples 52, 53, and these are monitored by a control computer not shown. Thus, the flow meter 54 and the thermocouples 52, 53 are connected to the control computer via signal lines for signal transmission therebetween. Signals carrying information concerning detections by the flow meter 54 and thermocouples 52, 53 are transmitted to the control computer via the signal lines, and the control computer transmits, to the flow meter 54 and the thermocouples 52, 53, instruction signals for controlling them.

The material of the ceramics plate 15 is aluminum nitride in this embodiment. The ceramic plate 15 has a circular heater 16 and a ring-shaped heater 57 concentrically embedded therein, which are connected to power supplies so that they can be independently supplied with electrical power. Thus, supplying an electrical power to the heaters 16, 57 can vary the temperature distribution on the ceramic plate. While not shown in detail in this embodiment, sockets electrically connected to the heaters 16, 57 provided in the ceramics plate 15 are engaged with electric plugs connected to the respective power supplies for the heaters provided externally. Furthermore, while only two heater power supply parts are described in this embodiment, four power supply parts are actually provided because connecters of opposite polarities are needed for one heater. Furthermore, the ceramics plate is not necessarily made of aluminum nitride, and it may be made of other materials.

In the ceramics plate 15, an internal electrode 17 is embedded above the heaters, which is to provide the wafer stage with the electrostatic chuck function and apply an RF bias thereto. Applying a direct current voltage to the internal electrode 17 causes a potential difference between the internal electrode 17 and the wafer 1 (the wafer 1 being exposed to a plasma and substantially at the ground potential). Thus, charges are stored between the internal electrode 17 and the back side surface of the wafer 1, and the wafer is fixed to the ceramics plate 15 by Coulomb force. In addition to the direct current voltage, a high frequency voltage is applied to the internal electrode 17 to supply a bias power to the wafer. The direct current voltage for electrostatic chuck is connected to the feeder line 19 via a coil 21. If a high frequency voltage is applied to the internal electrode 17, a bias voltage can be applied to the wafer 1, and therefore, ions in the plasma can be effectively drawn. Thus, it can be expected that advantages including enhancement in etch rate and improvement in shape resulting from etching are provided.

Reference numeral 55 denotes a fluorescent thermometer for measuring the temperature of the wafer. The cooling jacket 14 and the ceramics plate 15 each have a through hole formed at a corresponding location, and the fluorescent thermometer passes through the through holes, and the tip thereof is in contact with the back side surface of the wafer 1. While the fluorescent thermometer 55 is used for detecting the temperature of the wafer 1 in this embodiment, a radiation thermometer, a sheathed thermocouple or the like may be used in accordance with the range of temperature to be measured. In addition, the number of points of measurement is not limited to one. For example, if the temperature is measured at radially distributed three points, more specific temperature distribution data about the wafer 1 can be obtained. More measurement points provide more precise temperature data. Thus, in consideration of the cost and positions of the thermometers, the number of the thermometers can be appropriately chosen.

In order to effectively transfer a heat applied to the wafer during processing to the wafer stage and enhance the controllability of the wafer temperature, a heat conductive gas, such as helium gas, is introduced between the back side surface of the wafer and the ceramics plate. In this embodiment, the gas is supplied thereto via a hollow shaft 20. That is, the helium gas is introduced to the back side surface of the wafer via a throughhole 29 formed at the center of the ceramics plate 15. The pressure and mass flow of the helium gas are monitored by a pressure gauge 24 and a flow meter 25, respectively. Reference numeral 42 denotes a gas cylinder. Information derived from detection data of the pressure gauge 24, the flow meter 25 and the like can be displayed on a display apparatus, such as a monitor, connected to the apparatus, as described later. The display apparatus may be attached to the apparatus in advance or removably attached thereto.

If the wafer is processed by applying a bias voltage thereto in this way, the temperature of the wafer is increased due to heat input from the plasma. Control of the temperature of the wafer surface according to this embodiment of the present invention will be described in detail below.

Figure 4:
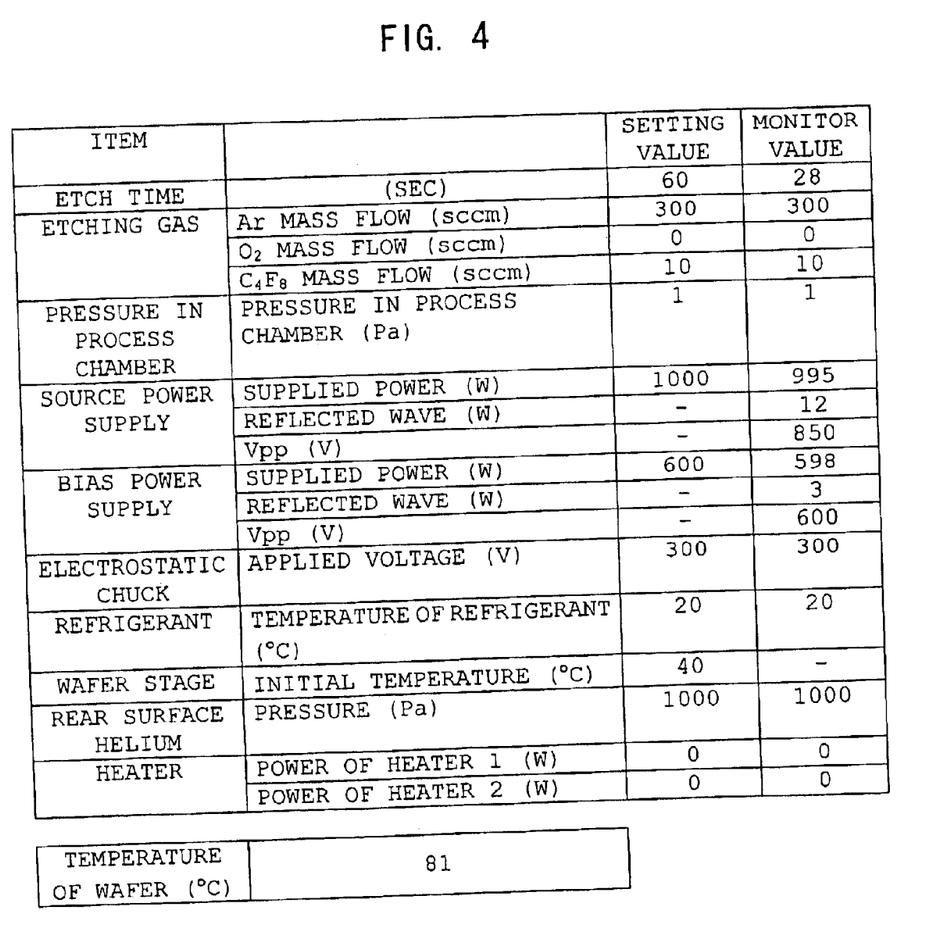
FIG. 4 is a view of a monitor screen according to the prior art.

FIG. 4 is a table of setting values and monitor values of etching conditions, which is displayed on the monitor screen of the etching apparatus if this embodiment is not applied. In this drawing, the setting values are items which are set by an operator, who is the actual user of the apparatus. Values for the respective etching conditions monitored at a predetermined point in time during actual processing by the apparatus are also displayed so that they can be compared against the setting values. In this embodiment, while the setting value for the processing time is 60 seconds, the displayed monitor value for the processing time is 28 seconds after the start of the processing. The time after the start of the processing, may be set by the operator at a predetermined value.

Of the monitor items, items which largely affect the wafer temperature are a bias power, a refrigerant temperature, a He back side gas pressure, and a heater power. In this embodiment, the bias power is set at 600 W, the refrigerant temperature is set at 20° C., the initial stage temperature is set at 40° C., and the He back side gas pressure is set at 1 kPa. Before starting the processing, the heater power is set at 50 W to keep the temperature of the wafer stage 2 at 40° C.

Figure 5:
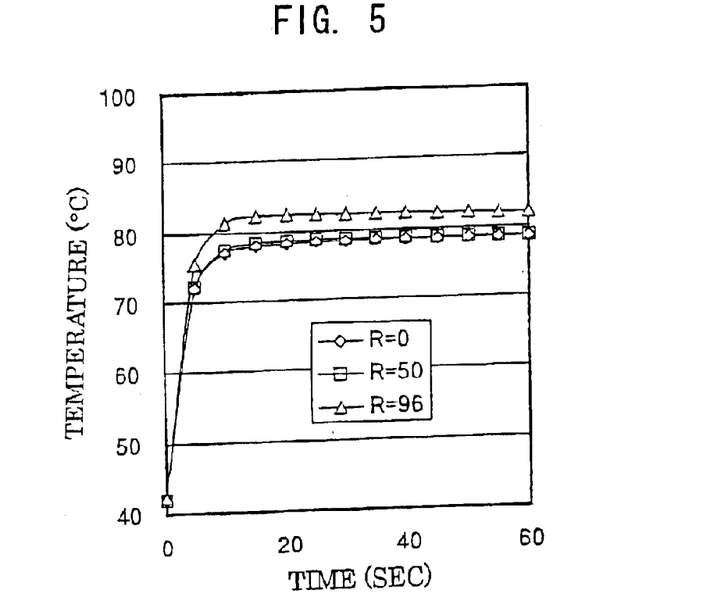
FIG. 5 shows an example of a variation of the temperature of a wafer being processed according to the prior art.

However, during the processing of the wafer 1, it is set at 0 W as shown in FIG. 4, because there is a heat input from the plasma. FIG. 5 shows variations of measured temperature of the wafer 1 processed according to this embodiment. In FIG. 5, the value R=0 represents that the temperature is measured by the fluorescent thermometer 55 at the center of the wafer, the value R=50 represents that the temperature is measured at a distance of 50 mm in a radial direction from the center of the wafer, and the value R=96 represents that the temperature is measured at a distance of 96 mm in a radial direction from the center of the wafer.

As shown in this drawing, the temperature of the wafer 1 during the processing gradually increases immediately after the start of the processing and, at last, reaches an average temperature of 79.8° C. Thus, it is proved that the actual wafer temperature is largely different from the refrigerant temperature of 20° C. and the stage temperature before the start of the processing of 40° C. Furthermore, it can be seen from FIG. 4 that at the location where the temperature of the wafer 1 of this embodiment is measured, the temperature 28 seconds after the start of the processing is 81° C. In this way, since the temperature of the wafer 1 is measured by the fluorescent thermometer, the operator operating the apparatus can notice the temperature of the back side surface of the wafer. However, it is difficult for the operator to predict the temperature of the wafer 1 before starting the processing and accurately set the operation conditions of the apparatus based on the prediction to implement a desired processing.

Thus, if the operator changes an operation condition of the apparatus or a parameter of the etching processing so as to bring the etching characteristics closer to a desired one, the wafer temperature is also changed in accordance with the set condition values or combination thereof, and thus, the desired etching characteristics cannot be attained. In this way, when a target etching characteristic, such as desired etch shape and etch rate, is to be attained, the prior art has a disadvantage in that a parameter to be adjusted and setting thereof largely affect the target etching characteristic itself.

Figure 6:
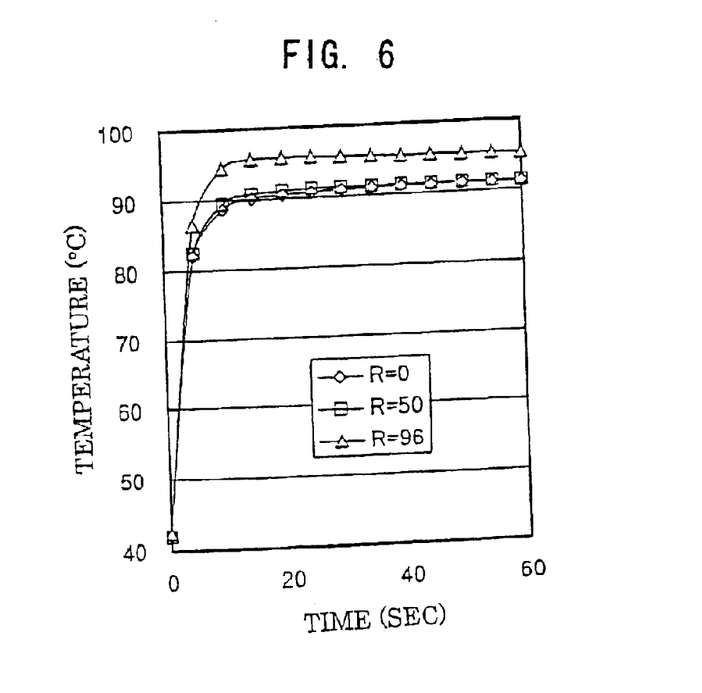
FIG. 6 shows an example of a variation of the temperature of a wafer being processed according to the prior art.

For example, a case will be described where a target etch rate is not attained and the bias power is increased to 800 W. Here, it is assumed that the temperature of the wafer finally attained after being processed for 60 seconds at 600 W is known from experiment or measurement by the fluorescent thermometer. Since the temperature of the wafer attained when it is processed at a bias power of 800 W is not known, if the wafer is processed under the same condition, the average temperature thereof is 93° C., as shown in FIG. 6. If the temperature varies largely in this way, the temperature affects the resulting etching characteristics and thus, it is difficult to assess the effect of the changed condition based on comparison with the previously obtained result.

Thus, data concerning the He back side gas pressure, the refrigerant temperature, the initial stage temperature and the like that are not changed if the bias power is increased to 800 W are required. However, according to the prior art, the operator using the apparatus must find an adequate condition on a trial-and-error basis, so that it may take a long time to find the adequate condition, and thus, the process of setting an adequate condition and starting operation of the apparatus so as to manufacture products with a predetermined performance is degraded inefficiency. In this embodiment, when the He back side gas pressure is set at 1.5 kPa, the average temperature of 82° C. is attained finally. However, in general, it is difficult for the operator to predict and set the He back side gas pressure down to the second decimal place, and it takes a long time to predict and set the value.

For example, to obtain precise data, the apparatus is operated plural times under different conditions, such as under different He back side gas pressures of 1.4 kPa, 1.5 kPa and 1.6 kPa. During this operation, it is difficult for the apparatus to perform processing so as to implement desired etching, and the throughput of the semiconductor processing is reduced. Besides, even if the data resulting from a plurality of times of operations is used, an extremely large number of operations is required to bring the average value of the temperature of the wafer 1 in a direction parallel to the surface thereof within a narrow range (for example, within ±0.5° C.). Therefore, the experiment preceding the processing for manufacturing the semiconductor devices to be shipped takes an extremely long time.

Now, another embodiment of the invention will be described. According to the invention, as shown in FIG. 3, the operator can set the wafer temperature in addition to the refrigerant temperature. Therefore, for example, in the case described above, the operator sets the wafer temperature at 79.8° C. via the input screen when changing the bias power from 600 W to 800 W, and the apparatus is set at an operation condition (processing condition) that provides the wafer temperature and operated in such a manner as to provide the condition. Thus, the apparatus can process the wafer with improved efficiency and precision.

Next, an arrangement for controlling the wafer temperature when a condition to be adjusted is changed will be described with reference to FIG. 2. A processing apparatus main unit 38 is connected to a control calculator 26 via a communication cable 28 and transmits/receives signals to/from the control calculator 26. In addition to the high frequency power supply, heater, electrostatic chuck power supply, fan, circulator, mechanism for controlling the mass flow of the He gas and the like described above, the processing apparatus main unit 38 comprises components serving as various sensors or valves.

The control computer 26 including a calculator, which is a control device for adjusting the operation of the apparatus, is connected, via a communication cable 31, to a monitor 30, which is a display device having a screen on which conditions of parts of the apparatus including the main unit 38 are displayed to allow the operator to confirm the conditions. The monitor 30 has an input mechanism 33 that is manipulated by the operator to enter instructions, can display operation conditions of the apparatus main unit 38 and setting items for the processing, and enables them to be entered. Thus, the operator can enter information including the bias power and He back side gas pressure while viewing the table in FIG. 3 displayed on the screen of the monitor 30. In addition, the input mechanism 33 can be used to enter desired value for items of information displayed on the monitor 30 and enter instructions for the displayed operation conditions for the respective parts, thereby setting the operation of the apparatus main unit.

The input mechanism 33 may be a panel or keyboard having buttons or switches to be manipulated, or a touch panel which is displayed on the screen of the monitor 30 to be touched by the operator for entry. Alternatively, the input mechanism may be visual or audio means. In such a case, the input mechanism 33 may be integrated with the monitor 30, which is display means, or attached to the apparatus main unit.

The He back side gas pressure, the refrigerant temperature, and the initial stage temperature which provide the wafer temperature set by the operator are determined by calculation by the control calculator 26. This calculation may be performed on information selected from among one or more pieces of information previously recorded or stored, or one data included in these pieces of information. There may be more than one combination of the parameters which provides the set wafer temperature, and in such a case, a desired combination should be selected from among the combinations.

In this embodiment, the He back side gas pressure is set at the original value of 1 kPa, and the initial stage temperature is set at 25° C. The refrigerant temperature, the remaining item, is 8° C., which is calculated by the control computer 26. If these values of the He back side gas pressure and refrigerant temperature can be entered by the operator via the input mechanism 33, in addition to being calculated and displayed, the operator can set the processing conditions more precisely. Furthermore, if other setting items or operation/processing conditions including the wafer temperature for the values entered in this way can be calculated and displayed, it can be readily determined how the operation of the apparatus or processing by the apparatus will be changed.

Such a calculation requires information or data about the amount of heat input to the wafer. The amount of heat input is considered to primarily depend on the power supplied from the bias power supply. However, it is also affected by the power supplied from the source power supply, which is to generate a plasma. Therefore, there can be contemplated a method of using a certain percent of the power supplied from the bias power supply, which is determined based on past experimental data, as the amount of heat input. However, to calculate the wafer temperature more precisely, a method of calculating the amount of heat input from the mass flow of the refrigerant and the increase in temperature is more effective.

In this embodiment, the temperatures of the refrigerant immediately before entering the cooling jacket and immediately after exiting the cooling jacket are measured by the thermocouples. The mass flow of the refrigerant is measured by the flow meter 54 incorporated in the piping. The computer has stored therein a formula for calculating physical property value and heat quantity of the refrigerant used, and calculates the heat quantity removed by the refrigerant in real time. As required, the result may be displayed on the monitor screen. Thus, a dummy wafer may be processed before actual processing, and the amount of heat input thereof may be calculated. In the example shown in FIG. 3, the amount of heat input is 456 W.

The result of the calculation is displayed on the monitor screen, and the operator checks the same for any problems. Here, appropriate ranges for the parameters may be stored in advance in the control computer, so that the check can be performed automatically. In this embodiment, the temperature of the refrigerant falls within an effective range therefore without any problem, and thus, the apparatus starts the actual processing. If it is out of the effective range, the conditions are entered again and calculation thereof is performed. In such a case, an error indication may be intelligibly displayed on the monitor screen. In this example, if the effective range of the temperature of the refrigerant is equal to or higher than 10° C., a He back side gas pressure of 1.2 kPa can provide a higher temperature of the refrigerant, and thus, allow the temperature of the refrigerant to fall within the effective range.

Figure 7:
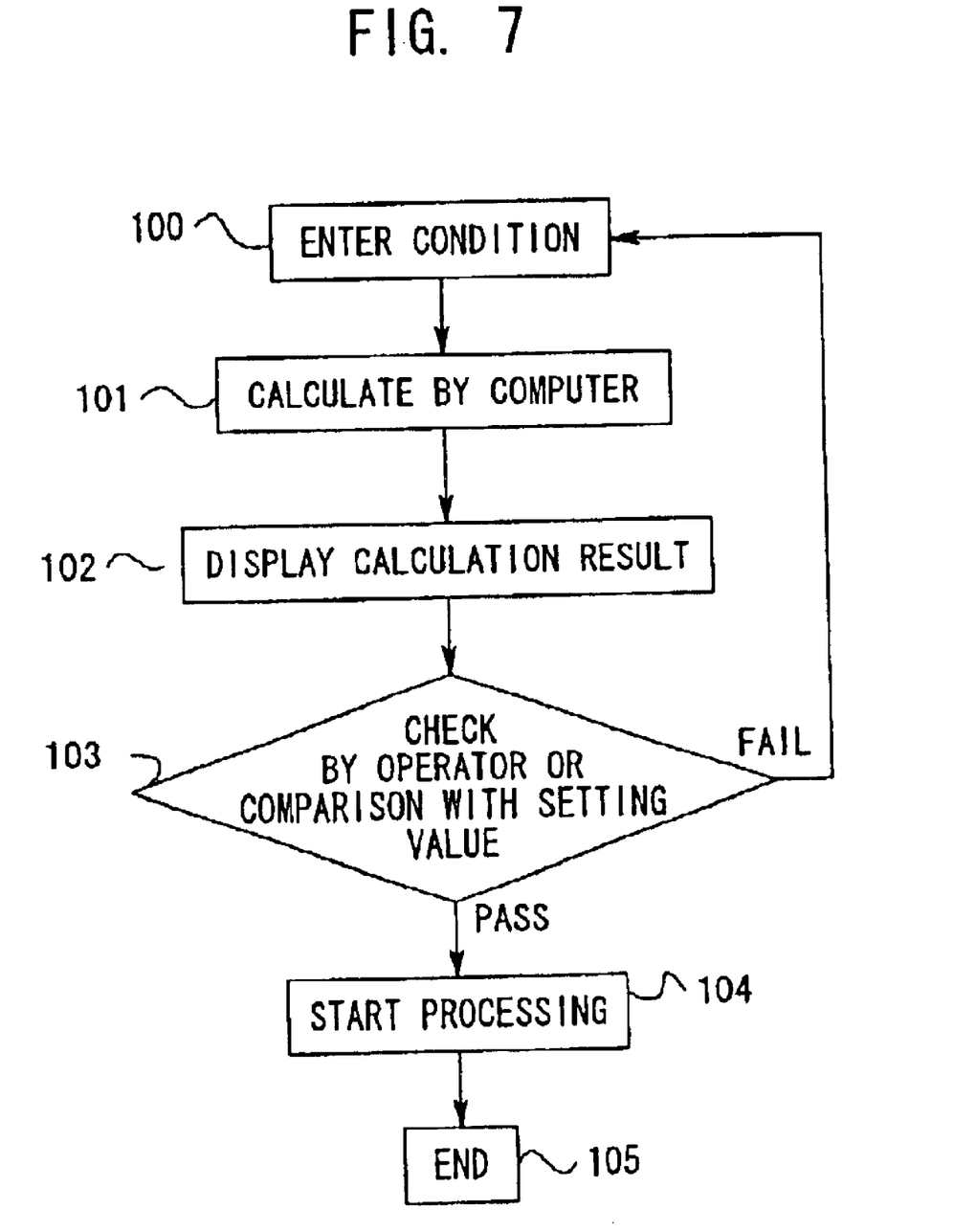
FIG. 7 is a flowchart of an operation according to the first embodiment of the invention.

FIG. 7 is a flow chart of an operation according to this embodiment. The operator enters a condition (100). Then, a condition that provides an entered temperature is calculated by the control computer (101). The calculation result is displayed on the monitor screen (102). The operator checks whether the processing condition resulting from the calculation has any problems or not. Here, this check may be performed in such a manner that a reference is previously set and the computer automatically perform the check based on the reference (103). If the check is passed, the processing is performed (104). If the check is not passed, another condition is entered repeatedly until the check is passed. Then, the processing is finished (105). The processing may be performed successively under the condition once determined.

Figure 8:
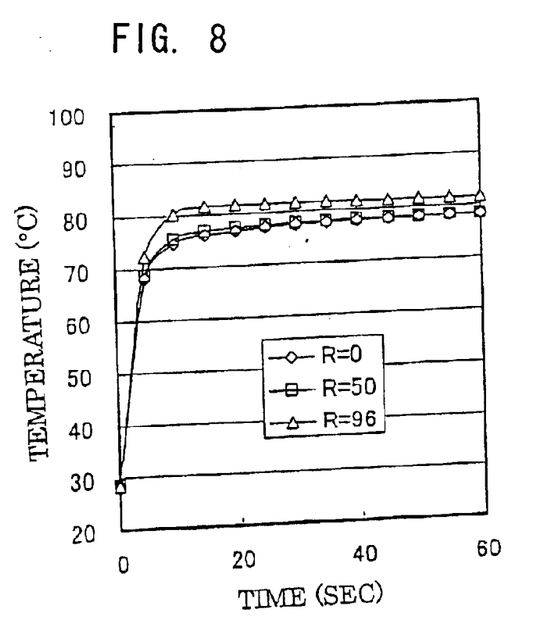
FIG. 8 shows an example of a variation of the temperature of a wafer being processed according to the first embodiment of the invention.

FIG. 8 shows variations of measured temperature of the wafer processed actually under the resulting condition in this embodiment. As a result, the average temperature is 79.3° C., which corresponds with the value obtained when the bias power is 600 W with a slight error of 0.5° C. Thus, what is to be considered is only the effect of the bias power, and the effect of the wafer temperature need not be considered. Since the operator sets only the temperature, the wafer temperature need not be measured in another experiment, which largely contributes to reduction in time for development of a new process.

While the items that affect the wafer temperature include the bias power, the He back side gas pressure, the refrigerant temperature, and the heater power in this embodiment, the items that affect the wafer temperature are not limited to these. Other parameters that affect the wafer temperature include: the mass flow of the refrigerant; if the He gas is introduced to the back side surface of the wafer at a plurality of points, the pressures of the He gas at the respective points; and if the wafer stage is at a high temperature, such as 400° C., the temperature of a surface of the wafer facing the wafer stage. Therefore, it can be said that there are infinite number of combinations of parameters that provide the set wafer temperature. However, in actual application, the effective ranges of the values for the respective items are naturally restricted, and thus, in many cases, the item to be determined by calculation is any of the refrigerant temperature, the He back side gas pressure and the heater power.

Furthermore, while the average temperature is set as the wafer temperature in this embodiment, it is not limited thereto. For example, the range of the temperature in the wafer surface maybe set, or if required, the temperature distribution itself may be set.

In the case where the temperature distribution is set, the point in time when the distribution is obtained after starting the processing is important. This is because, in the example described above, if the temperature during the processing is low, the wafer temperature distribution is substantially uniform immediately after the start of the processing, and as the processing of the wafer proceeds, the wafer temperature totally continues to increase, and the largest temperature distribution results immediately before the processing is finished. This implies that, to determine the processing condition based on calculation by a computer or the like, comparison with the temperature distribution obtained immediately before the processing is finished can be performed. However, when the wafer is processed at a higher temperature, for example, in the case where the stage temperature is 300° C. or higher, the temperature is the highest immediately after the processing is started. In this way, when processing the wafer, the wafer 1 is mounted on the wafer stage 2, the wafer 1 is stuck to the wafer stage 2, a plasma is generated, and then the processing of the surface of the wafer by the plasma is started. As the processing proceeds, the temperature of the wafer 1 and the temperature distribution vary with time.

Figure 9:
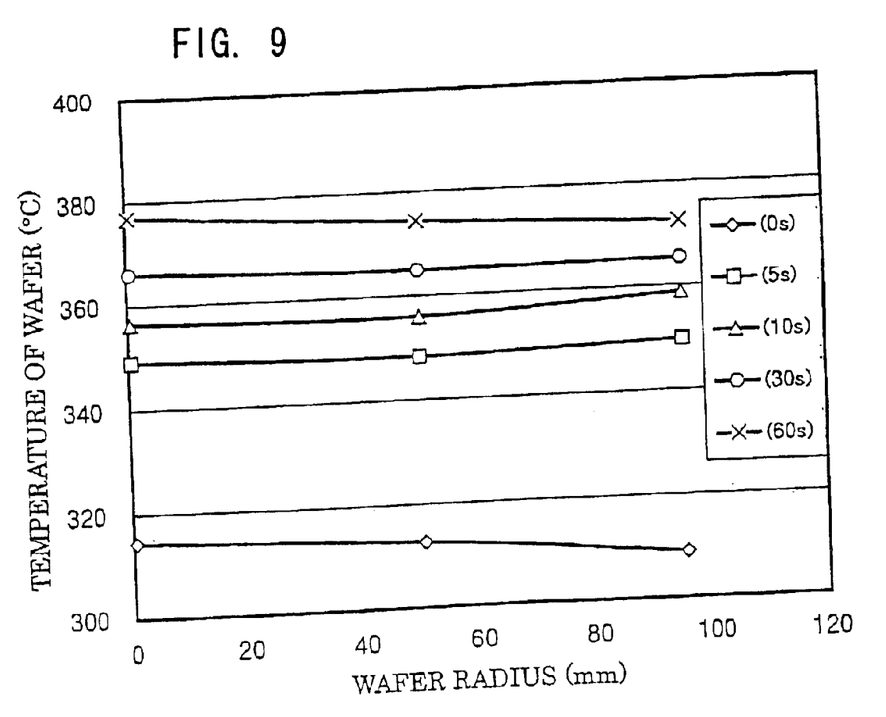
FIG. 9 shows an example of a variation of the temperature of a wafer being processed according to the first embodiment of the invention.

FIG. 9 shows a measurement result of wafer temperature distributions obtained in the case where the wafer temperature is set at 300° C. in the first embodiment. In this example, the heat conductive sheet is removed to suppress heat transfer to the wafer stage 2, thereby enhancing the heat insulation effect. As can be seen from this drawing, the wafer temperature, which is 312° C.±6° C. immediately after the processing is started, is 365° C.±1° C. after a lapse of 30 seconds and is 375° C.±5° C. after a lapse of 60 seconds, that is, immediately before the processing is finished. In this way, as the processing proceeds, the wafer temperature totally increases, and the difference in temperature between a part near the outer periphery of the wafer and apart near the center thereof becomes larger. It can be considered that this is due to the fact that radiation from the outer periphery largely contributes to heat loss.

In such a case, it is desirable that the elapsed time after the processing is started and the temperature distribution obtained at that time can be set. That is, in the case of a processing in which the temperature distribution varies with time as described above, if the apparatus is operated with an uniform temperature distribution set from the start of the processing to the end thereof, there is a possibility that the period of time in which a desired etching performance is attained is extremely short, and the processing is performed with an etching performance largely different from the desired one during the remaining period of time. As a result, the precision of the semiconductor processing is reduced and the performance of the resulting element is degraded. If the operator using the apparatus can set a processing parameter with reference to etching characteristics, such as etch rate, at one or more predetermined points in time, the processing can be performed with an etching characteristic closer to a desired one at the predetermined points in time, the reduction of the processing precision can be suppressed, whereby the processing can be performed with a higher reliability. To this end, according to this embodiment, there is provided a function of displaying on the monitor a calculation result of a predicted time variation of the wafer temperature distribution. The operator (user of the apparatus) can check the result to determine whether the setting is good or not, or adequate or not. Thus, there are provided advantages that the efficiency of the operation is improved, the reliability of the resulting element is enhanced and thus, the throughput is improved.

Figure 10:
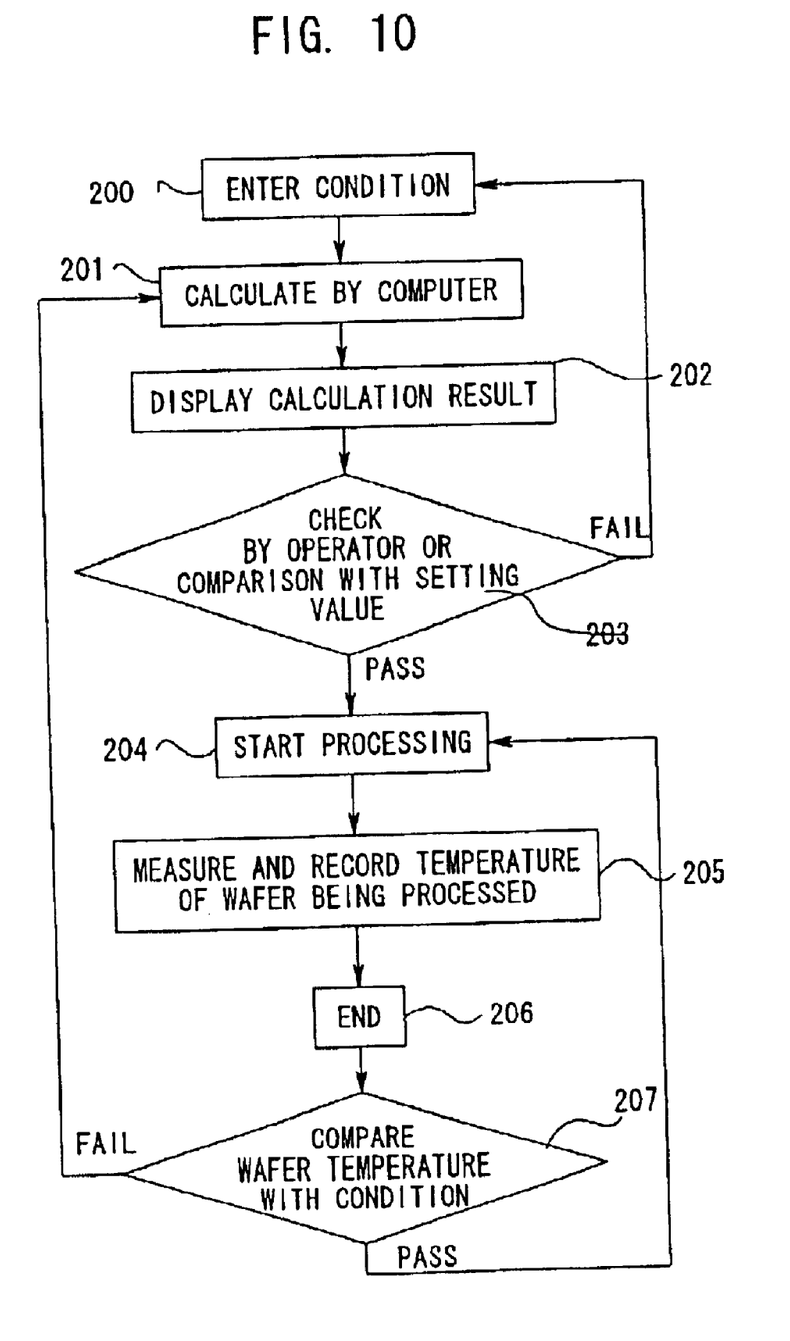
FIG. 10 is a flowchart of an operation according to a second embodiment of the invention.

FIG. 10 shows a processing method according to a second embodiment of the invention. This invention provides a method which is effective in suppressing a variation in wafer temperature which is caused by the condition of the plasma being changed as the number of wafers processed increases.

First, the operator enters conditions including a wafer temperature (200). A parameter that provides the wafer temperature is calculated by a computer (201). The calculation result is displayed on the monitor screen (202), and the operator determines whether there is any problem or not. Here, this determination may be automatically performed by the computer having appropriate range of the respective parameters previously stored therein (203).

If the entered condition is determined to be appropriate, the wafer is processed based on the entered condition (204). Up to this step, the process is the same as in the first embodiment. Then, the temperature of the wafer being processed is measured, and the measured temperature is recorded in the computer (205). After the processing is finished (206), the measurement result is compared with the condition (207). If the comparison proves that the result falls within a predetermined range of values, and thus, the result is determined to be appropriate, the processing of the next wafer is performed (204). If the entered condition is determined to be inappropriate, calculation by the computer is performed again to change the processing parameter. The processing parameter to be changed may be the He back side gas pressure, the refrigerant temperature, the mass flow of the refrigerant, and the heater power. Among these, the He back side gas pressure is highly responsive to the change. Therefore, if the He back side gas pressure is changed, the apparatus can reflect the change in a shorter time, and thus, the throughput of the apparatus can be improved and the operability thereof can be increased. Of course, the parameter to be changed is not limited to this and can be appropriately selected.

In this way, according to this embodiment, the time variation of the wafer temperature can be prevented, and thus, the yield can be enhanced and the operability of the apparatus can be improved.

While the processing condition is changed for each wafer in the second embodiment described above, the parameter can be changed while one wafer is being processed. This is effective in suppressing time variations of the temperature and temperature distribution of the wafer being processed. To this end, when the wafer temperature is calculated by the computer in FIG. 7 (101), the parameter may be calculated at arbitrarily set time intervals, for example. If the calculation result is possible to be implemented, the processing is performed in accordance with the processing parameter determined based on the calculation result.

If the wafer is processed in such a manner, the variation of the wafer temperature can be suppressed to a minimum, and thus, a processing method with high reproducibility and improved etching characteristics can be provided. Furthermore, this processing method can be combined with the first embodiment. In this case, the time variation of the wafer temperature can be suppressed.

As described above, according to this embodiment, the processing condition that provide the wafer temperature set by the operator is determined by calculation, and the wafer is processed based on the condition. Therefore, the temperature of the wafer can be readily controlled. In addition, since the processing condition can be reviewed every time one wafer is processed, a processing method with reduced time variation can be provided.

According to this invention, a semiconductor processing apparatus with an improved operation efficiency can be provided. In addition, a semiconductor processing apparatus that can process a semiconductor wafer with a higher precision can be provided.

What is claimed is:

1. A semiconductor processing apparatus that plasma-processes a semiconductor wafer mounted on a stage placed in a container, comprising:

setting means for enabling a user to set a temperature of said semiconductor wafer; and control means for controlling an operation of the semiconductor processing apparatus based on information about the temperature of the semiconductor wafer set by the setting means.

2. The semiconductor processing apparatus according to claim 1, wherein the semiconductor processing apparatus has a function of setting an operation condition of the semiconductor processing apparatus based on said set temperature of the wafer.

3. The semiconductor processing apparatus according to claim 1, wherein conditions of said operation include at least one of a temperature of a thermal medium that adjusts a temperature of a sample stage on which said semiconductor is mounted, a heater for heating said sample stage, a pressure of a gas introduced between said semiconductor wafer and said sample stage, and a high frequency power applied to said sample stage.

4. The semiconductor processing apparatus according to claim 2, further comprising:

display means for displaying said set operation condition; and input means for enabling the user to input said operation condition.

5. The semiconductor processing apparatus according to claim 3, further comprising:

display means for displaying said set operation condition; and input means for enabling the user to input said operation condition.

6. The semiconductor processing apparatus according to claim 1, wherein the plasma-process of said semiconductor wafer is an etching of said semiconductor wafer.

7. A semiconductor processing apparatus for etching a semiconductor wafer disposed on a stage inside a container using a plasma generated therein, comprising:

an inputting device which enables a user to input and command at least one operating condition inside said container during the operation of said apparatus, the at least one operating condition including a temperature of said semiconductor wafer; and a controller which sends at least one signal to a plurality of portions of the apparatus and controls the processing of said semiconductor wafer so that said temperature of said semiconductor wafer is provided and the apparatus is operated so as to provide said at least one operating condition inputted through said inputting device.

8. A semiconductor processing apparatus for etching a semiconductor wafer disposed on a stage inside a container using a plasma generated therein, comprising:

an inputting device which enables a user to input and command at least one operating condition concerning the stage during the operation of said apparatus and an operating condition of a temperature of said semiconductor wafer; and a controller which sends at least one signal to at least one portion of said stage and controls the processing of said semiconductor wafer so that said temperature of said semiconductor wafer is provided and the apparatus is operated so as to provide said operating conditions inputted through said inputting device.

9. The semiconductor processing apparatus according to claim 8, wherein said controller controls the processing of said semiconductor wafer during the operation of said apparatus so that said temperature of said semiconductor wafer which is inputted and commanded is maintained when a change in any of said at least one operating condition other than said operating condition of said temperature of said semiconductor wafer is inputted.

10. The semiconductor processing apparatus according to claim 8, wherein said at least one operating condition concerning said stage includes at least one of a temperature of a thermal medium that adjusts a temperature of said stage, a heating of said stage by a heater, a pressure of a gas introduced between said semiconductor wafer and said stage, and a radio frequency power applied to said stage.

11. The semiconductor processing apparatus according to claim 10, wherein said controller controls the processing of said semiconductor wafer during the operation of said apparatus so that said temperature of said semiconductor wafer which is inputted and commanded is maintained when a change in said at least one operating condition concerning the stage is inputted.

* * * * *